(12) United States Patent
Russell et al.

(10) Patent No.: US 10,024,747 B2
(45) Date of Patent: Jul. 17, 2018

(54) PRESSURE PORTS AND RELATED METHODS

(71) Applicant: Merit Medical Systems, Inc., South Jordan, UT (US)

(72) Inventors: Rick Russell, Cottonwood Heights, UT (US); Jonathan Cheney, West Jordan, UT (US); Scott Sidwell, Riverton, UT (US); Luca Salmaso, Agno (CH); Jeff Chance, South Jordan, UT (US); Greg Liddiard, Riverton, UT (US)

(73) Assignee: Merit Medical Systems, Inc., South Jordan, UT (US)

( * ) Notice: Subject to any disclaimer, the term of this patent is extended or adjusted under 35 U.S.C. 154(b) by 2 days.

(21) Appl. No.: 15/185,713

(22) Filed: Jun. 17, 2016

(65) Prior Publication Data
US 2016/0370246 A1   Dec. 22, 2016

Related U.S. Application Data

(60) Provisional application No. 62/182,091, filed on Jun. 19, 2015.

(51) Int. Cl.
*G01L 7/00* (2006.01)
*G01L 19/14* (2006.01)
*G01L 19/00* (2006.01)

(52) U.S. Cl.
CPC ........ *G01L 19/147* (2013.01); *G01L 19/0038* (2013.01); *G01L 19/0084* (2013.01);
(Continued)

(58) Field of Classification Search
CPC ............... G01L 19/147; G01L 19/0038; G01L 19/0084; G01L 19/143; G01L 19/0007;
(Continued)

(56) References Cited

U.S. PATENT DOCUMENTS

| | | | |
|---|---|---|---|
| 2007/0272028 A1* | 11/2007 | Fujimoto | G01L 19/0007 73/756 |
| 2009/0314096 A1* | 12/2009 | Colombo | G01L 19/0084 73/754 |

(Continued)

FOREIGN PATENT DOCUMENTS

| | | | | |
|---|---|---|---|---|
| WO | 2014127938 | | 8/2014 | |
| WO | WO 2014127938 | * | 8/2014 | ............. G01L 19/04 |

OTHER PUBLICATIONS

International Search Report and Written Opinion dated Sep. 30, 2016 for PCT/US2016/038149.

*Primary Examiner* — Manish S Shah
*Assistant Examiner* — Nigel Plumb
(74) *Attorney, Agent, or Firm* — Stoel Rives LLP

(57) ABSTRACT

A pressure port assembly and related components and methods are disclosed. In some instances, the pressure port assembly may comprise a pressure port body, including pressure port bodies composed of a continuous material. Pressure port bodies within the scope of this disclosure may be coupled to pressure sensing elements, including pressure transducers. Apertures or other flow paths may be provided across a pressure port body. Methods of integrally forming a pressure port body comprising a continuous material are also disclosed.

28 Claims, 8 Drawing Sheets

(52) U.S. Cl.
CPC .. *G01L 19/143* (2013.01); *H01L 2224/48145* (2013.01); *H01L 2224/49052* (2013.01)

(58) Field of Classification Search
CPC ............... G01L 13/025; G01L 7/00; H01L 2224/48145; H01L 2224/49052
USPC ............ 73/756, 717, 716, 715, 700
See application file for complete search history.

(56) References Cited

U.S. PATENT DOCUMENTS

| | | | |
|---|---|---|---|
| 2012/0067132 A1* | 3/2012 | Teli ................... | G01L 19/0038 73/715 |
| 2012/0104518 A1* | 5/2012 | Salmaso ............. | G01L 9/0042 257/415 |
| 2013/0056100 A1* | 3/2013 | Imaizumi ............ | B60T 13/662 137/560 |
| 2013/0133432 A1* | 5/2013 | Wagner ............... | G01L 19/146 73/716 |

\* cited by examiner

PRESSURE PORTS AND RELATED METHODS

RELATED CASES

This application claims priority to U.S. Provisional Application No. 62/182,091, filed on Jun. 19, 2015 and titled "PRESSURE PORTS AND RELATED METHODS," which is hereby incorporated by reference in its entirety.

TECHNICAL FIELD

The present disclosure relates generally to the field of pressure sensing assemblies and components. More particularly, some embodiments of the disclosure are directed to ports or ferrules for use with pressure transducers.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which.

DETAILED DESCRIPTION

This disclosure broadly relates to pressure ports, pressure port assemblies, sensor assemblies, and related methods. As used herein, a "pressure port" refers to any mounting body or component configured to accommodate a pressure-sensing element, such as a pressure transducer. Exemplary pressure ports include any body, housing, mount, or similar elements, such as ferrules, grommets, and so forth. Pressure ports may be used to secure a pressure transducer within a larger assembly. Additionally, pressure ports may be configured to protect portions of a pressure transducer from corrosive or harsh environments. Portions of a pressure port may form a fluidic seal against other elements of an assembly.

The components of the embodiments as generally described and illustrated in the figures herein can be arranged and designed in a wide variety of different configurations. Thus, the following more detailed description of various embodiments, as represented in the figures, is not intended to limit the scope of the present disclosure, but is merely representative of various embodiments. While various aspects of the embodiments are presented in drawings, the drawings are not necessarily drawn to scale unless specifically indicated.

The phrase "coupled to" is broad enough to refer to any suitable coupling or other form of interaction between two or more entities, including mechanical, fluid, and thermal interaction. Two components may be coupled to each other even though they are not in direct contact with each other. For example, two components may be coupled to one another through an intermediate component. The phrases "attached to" and "attached directly to" refer to interaction between two or more entities which are in direct contact with each other and/or are separated from each other only by a fastener (e.g., adhesives, screws) of any suitable variety. The phrase "fluid communication" refers to arrangements in which a fluid (e.g., a gas or a liquid) can flow from one element to another element when the elements are in fluid communication with each other.

Figure 1:
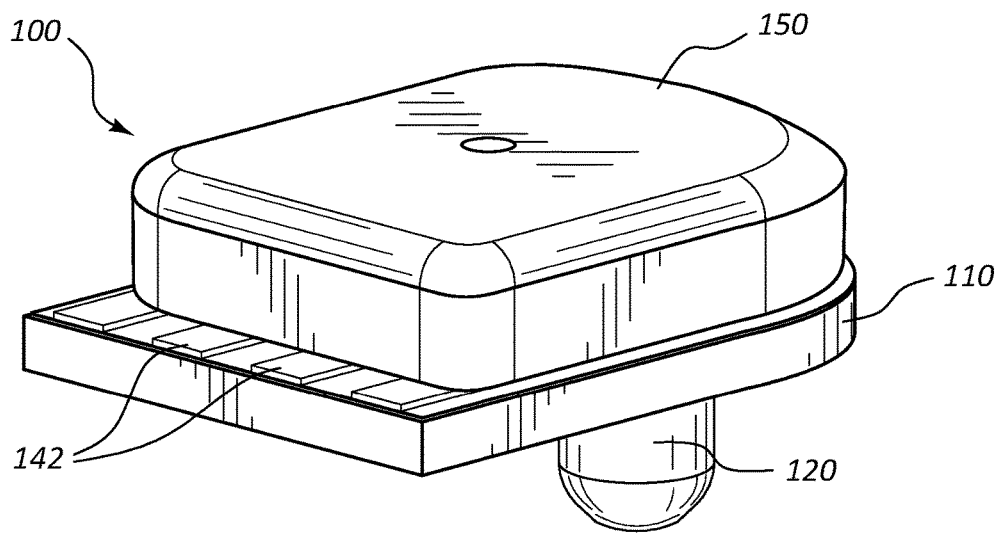
FIG. 1 is a pictorial view of a pressure port assembly.
Figure 2:
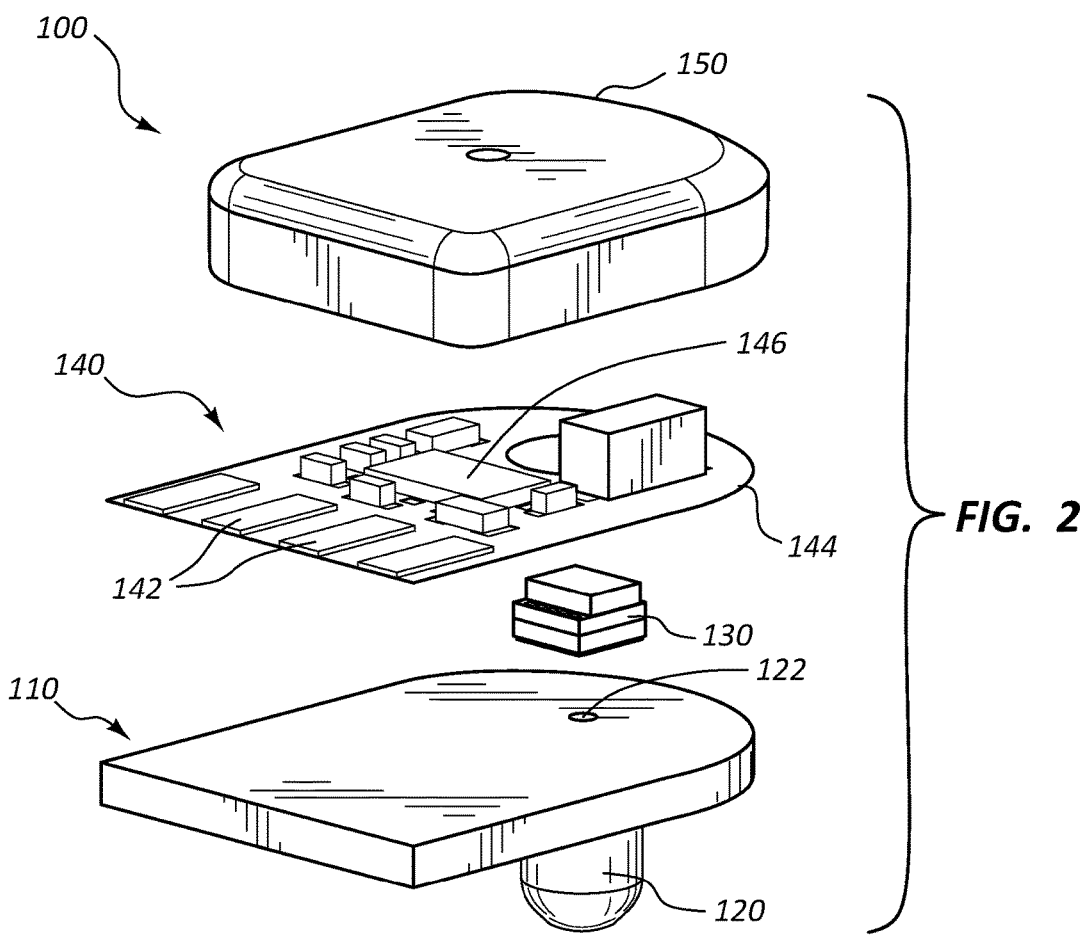
FIG. 2 is an exploded view of the pressure port assembly of FIG. 1.

FIG. 1 is a pictorial view of a pressure port assembly 100, which may also be referred to as a "sensor assembly." FIG. 2 is an exploded view of the pressure port assembly 100 of FIG. 1. As shown in FIGS. 1 and 2, the pressure port assembly 100 may comprise a pressure port body 110, which may also be referred to as a sensor mounting body. A pressure sensing element, such as pressure transducer 130 may be coupled to the pressure port body 110. Still further, an electronics assembly 140 may be coupled to the pressure port body 110 and may be in electrical communication with the pressure transducer 130. Finally, a cover 150 may be coupled to the pressure port body 110. In some instances, the cover 150 may be disposed such that it is disposed over all or a portion of the pressure transducer 130 and/or the electronics assembly 140. The cover 150 may be made from any suitable material, such as ceramic or plastic.

The pressure port assembly 100 may be understood or characterized in a number of ways. For example, the pressure port assembly 100 may be characterized as an assembly of components configured to be used in connection with a larger assembly. The pressure port body 110 may thus provide a mounting surface or attachment point for elements of the pressure port assembly 100 and function as an attachment member to couple the pressure port assembly 100 to the larger assembly. Further, the pressure port assembly 100 may be understood as controlling fluid communication to various portions of the pressure port assembly 100. For example, the pressure port assembly 100 may be designed such that portions of the pressure port assembly 100, for example the electronics assembly 140, are isolated from communication with a fluid to be measured, while allowing communication with a portion of the pressure transducer 130. The pressure port assembly 100 may thus be configured to interact with the larger assembly to provide surfaces for fluidic seals as well as mounting or attachment surfaces. These characterizations of the pressure port assembly 100 are further described and outlined below.

The pressure port body 110 may be configured as an interface between components mounted on the pressure port body 110 and a larger assembly. As noted above, elements such as a pressure sensing element, such as pressure transducer 130, and various electronic components, such as the electronics assembly 140, may be coupled directly to the pressure port body 110. The pressure port body 110 may, in turn, be an element of a larger assembly, positioning the pressure transducer 130 and electronics assembly 140 within the larger assembly to measure pressure and/or provide an output signal.

Accordingly, in some embodiments, the pressure port assembly 100 may be understood as an integrated component, a package comprising pressure sensing elements that can be disposed within, and as part of, a larger assembly. For example, the pressure port assembly 100 may be sized and designed to be disposed in communication with the fluid flow path, with the pressure port body 110 providing an attachment interface to a housing or other element defining the fluid flow path, and the pressure transducer 130 in fluid communication with the fluid flow path. The pressure port assembly 100 may be configured as an element of any number of larger assemblies. For example, the pressure port assembly 100 may be sized or configured to be placed within a portion of a syringe housing, with the pressure port body 110 coupled to the housing and the pressure transducer 130 in fluid communication with an interior portion of the syringe. Another example may be a fuel line, with the pressure port body 110 configured to be placed within a housing and coupled to an element of the fuel line, and the pressure transducer 130 in fluid communication with fluid within the fuel line.

The pressure port assembly 100 may thus be understood both as an integrated platform for elements of the assembly (such as the pressure transducer 130 and the electronics assembly 140) and as an interface platform with a larger assembly. As such, the relative positions, physical or material properties, or other characteristics of the elements of the pressure port assembly 100 may be designed or tailored to meet design characteristics driven both by designing an integrated pressure port assembly 100 and by configuring that assembly for interaction with a larger assembly.

For example, in addition to providing a mounting surface to interface with the larger assembly, the pressure port body 110 may separate or isolate portions of the pressure port assembly 100 from portions of the larger assembly. For example, the pressure port body 110 may comprise a material which resists corrosion or breakdown in the presence of harsh or corrosive environmental conditions. The pressure port body 110 may separate or isolate other portions of the pressure port assembly 100 from such conditions, while providing fluid communication only to targeted portions of the pressure port assembly 100.

The pressure port body 110 shown in FIGS. 1 and 2 comprises an aperture top opening 122 in the pressure port body 110. The aperture top opening 122 may be in communication with an aperture (125 of FIG. 4) and may thus provide fluid communication from one side of the pressure port body 110 to the other, thus providing fluid communication along a defined and controlled path. Other portions of the pressure port body 110 may be fluid-impermeable and/or sealed against fluid communication around the pressure port body 110 in order to control fluid communication with respect to other elements of the pressure port assembly 100, such as the pressure transducer 130 and/or the electronics assembly 140.

In some instances, it may be desirable to isolate the electronics assembly 140 and portions of the pressure transducer 130 from fluid communication with the fluid to be measured. Uncontrolled fluid communication with these elements may compromise the integrity of these components, by corroding or otherwise damaging the components. Further, uncontrolled fluid communication around the pressure transducer 130 may compromise the pressure reading of the pressure transducer 130. In the illustrated embodiment, the pressure transducer 130 and electronics assembly 140 are mounted on a first surface of the pressure port body 110, transducer surface 112.

For convenience in describing the components herein, the transducer surface 112 may be understood as a top surface of the pressure port body 110, as FIGS. 1 and 2 are oriented with the transducer surface 112 directed toward the top of the figures. Thus the aperture (125 of FIG. 4) opening in the transducer surface 112 is referenced as a top opening 122. As detailed below, the opposing opening is referenced as a bottom opening (124 of FIG. 4). Other components herein may be referred to using this same relative coordinate system. References to "top" and "bottom" are for convenience only and do not imply an absolute coordinate system or any particular orientation of the pressure port assembly 100 within a larger assembly or with reference to an external or environmental coordinate system.

The transducer surface 112 may be isolated from fluid communication with the fluid to be measured. For example, sealing members may prevent fluid flow around the periphery of the pressure port body 110, and the material of the pressure port body 110 may prevent fluid communication through the pressure port body 110. As further detailed below, the aperture (125 of FIG. 4) may be relatively disposed such that fluid communication at the transducer surface 112 is isolated to the aperture top opening 122.

In some embodiments, the pressure transducer 130 may be disposed directly over the top opening 122 such that the aperture (125 of FIG. 4) is in communication with a bottom surface of the pressure transducer 130. A bond between the pressure transducer 130 and the transducer surface 112 of the pressure port body 110 may seal the interface between the pressure transducer 130 and the transducer surface 112, thus allowing for fluid communication between one surface of the pressure transducer 130 and the aperture (125 of FIG. 4) without fluid communication between the aperture (125 of FIG. 4) and the transducer surface 112 generally.

The pressure transducer 130 may be attached to the transducer surface 112 through bonding, welding, adhesives, chemical bonding, mechanical bonding, soldering and so forth. In some instances, eutectic solder is used to bond the pressure transducer 130 to the transducer surface 112 of the pressure port body 110. In another example, glass bonding, such as glass soldering or frit bonding, is used to couple the pressure transducer 130 to the transducer surface 112 of the pressure port body 110.

The pressure transducer 130 may comprise any type of pressure sensing element or component. In some embodiments, a MEMS transducer may be used. The portion of the pressure transducer 130 configured for interaction with the fluid to be measured may be positioned in fluid communication with the aperture (125 of FIG. 4) while the remaining surfaces of the pressure transducer 130 may be isolated from fluid communication with the aperture (125 of FIG. 4) due to one or more of: the impermeability of the pressure port body 110, seals preventing fluid communication around the periphery of the pressure port body 110, and the nature of the bond or seal between the pressure transducer 130 and the transducer surface 112.

Positioning of the pressure transducer 130 and the electronics assembly 140 on the transducer surface 112, in embodiments where this area is not in fluid communication with the fluid to be measured, may facilitate coupling between the pressure transducer 130 and the electronics assembly 140 and protect these components. For example, the fluid to be measured may be corrosive or otherwise incompatible for contact with these elements. Still further, electrical pathways between portions of the electronics assembly 140 may be disrupted or compromised by the presence of a certain fluids. Mounting the pressure transducer 130 on the top side of the pressure port body 110, while the fluid to be measured is disposed on the bottom side thereof, may thus facilitate use of certain types of components and arrangements within the pressure port assembly 100.

The electronics assembly 140 may be attached directly to the pressure port body 110. In some embodiments, the pressure port body 110 may comprise a ceramic or other substrate suitable for direct metallization to create electrical pathways. Electrical pathways or other portions of the electronics assembly 140 may be created by deposition, etching, doping, printing, or other methods, including instances where these processes are done directly on the pressure port body 110.

In other embodiments, the electronics assembly 140 may be initially printed or otherwise formed on a secondary member, such as chip carrier 144. The chip carrier 144 may comprise a plastic or other substrate upon which components of the electronics assembly 140 are initially deposited, printed, or otherwise coupled thereto. The chip carrier 144 may then be coupled to the pressure port body 110. In some embodiments, duplication technology, such as reel-to-reel printing or other methods, may be used to produce the chip carrier 144 with the electronics assembly 140 components thereon.

The electronics components may further comprise a plurality of contacts 142. The contacts 142 may be directly printed on, directly deposited on, or otherwise attached directly to the pressure port body 110. In other instances, the contacts 142 may be initially disposed on a chip carrier (such as chip carrier 144) which is coupled to the pressure port body 110. The contacts 142 may be in electrical communication with pathways of the electronics assembly 140, including pathways in ultimate connection with the pressure transducer 130. The contacts 142 may thus provide a single input or output coupling location.

In some embodiments, the electronics components further include an integrated circuit 146. The integrated circuit 146 may perform one or more operations on a signal from the pressure transducer 130 and then send or relay the signal to the electrical contacts 142.

In some embodiments, the transducer 130 and various electronics components, such as the integrated circuit 146 are discrete and separate components. In other embodiments, the transducer 130 and the integrated circuit 146 (and/or one or more electronic components) are incorporated into a single component. For example, in some embodiments the transducer 130 and the integrated circuit 149 may both be incorporated into a single chip and/or may both be disposed in a common housing.

Figure 3:
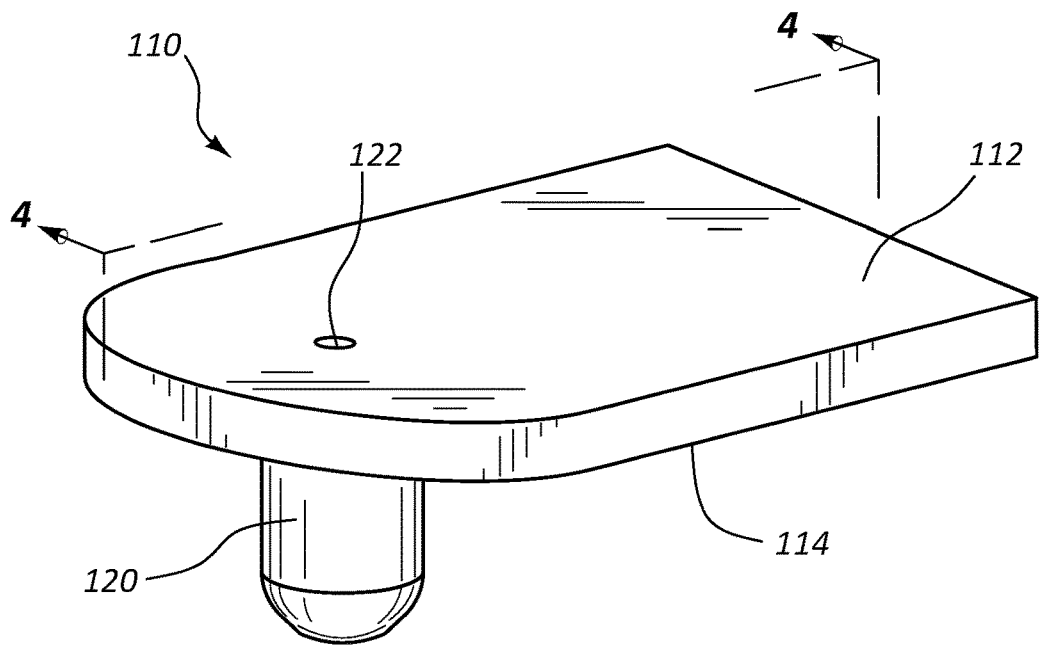
FIG. 3 is a pictorial view of a pressure port body of the pressure port assembly of FIG. 1.
Figure 4:
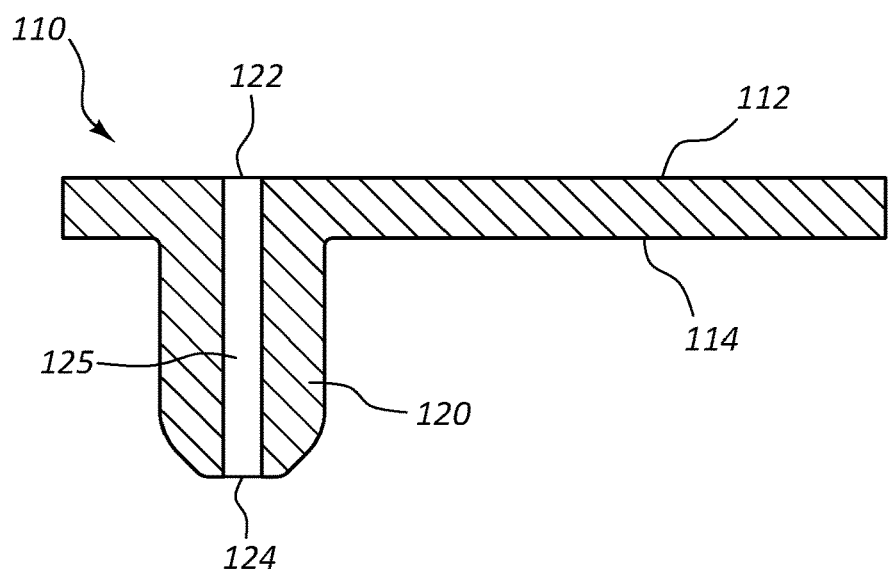
FIG. 4 is a side cross-sectional view of the pressure port body of FIG. 3.

FIG. 3 is a pictorial view of a pressure port body 110 of the pressure port assembly (100 of FIG. 1). FIG. 4 is a side cross-sectional view of the pressure port body 110 of FIG. 3.

As shown in FIGS. 1-4, the pressure port body 110 may comprise a first surface, such as a top surface, or the transducer surface 112 of the illustrated embodiment. The transducer surface 112 may be substantially flat or otherwise configured such that portions thereof may be directly metallized as part of the electronics assembly 140. The transducer surface 112 may be relatively positioned as a mounting surface for the pressure transducer 130 and/or electronics assembly 140 in some embodiments. Further, seals or other components may isolate the transducer surface 112 from fluid communication with a fluid to be measured.

The pressure port body 110 may further comprise a second surface such as bottom surface 114, disposed opposite the transducer surface 112. In some instances, portions of the bottom surface 114 may be in fluid communication with the fluid to be measured. Seals or other components may prevent fluid communication around the periphery of the bottom surface 114 in some instances.

In the illustrated embodiment, the pressure port body 110 further comprises a protrusion 120 extending from the bottom surface 114. The protrusion 120 may be an integral component or portion of the pressure port body 110. In the illustrated embodiment, the protrusion 120 is shown with a circular cross section, though any other shape is within the scope of this disclosure. In the depicted embodiment, the protrusion 120 is offset to one side. In other embodiments, the protrusion may be centered such that the protrusion extends from a middle of the pressure port body 110. Centering of the protrusion may, in some instances, allow for a decreased overall size of the pressure port assembly 100.

An aperture 125 may extend from a bottom opening 124 to a top opening 122, providing a defined path for fluid communication across the pressure port body 110. Again, the bonding of the pressure transducer 130 to the transducer surface 112 may seal the top opening 122 of the aperture 125, allowing for fluid communication between the aperture 125 and the bottom of the pressure transducer 130, but preventing fluid communication between the aperture 125 and other components disposed on the transducer surface 112.

In the illustrated embodiment, the bottom opening 124 of the aperture 125 is positioned on the protrusion 120. In other embodiments, the bottom opening 124 may be disposed in the bottom surface 114 of the pressure port body 110, including embodiments with no protrusion 120.

When the pressure port assembly 100 is disposed within a larger assembly, the protrusion 120 may extend toward a fluid to be measured. For example, the protrusion 120 may extend such that is it adjacent to a fluid flow path. The aperture 125 would thus provide fluid communication from that fluid flow path to the pressure transducer 130, facilitating pressure measurements of the fluid in the flow path.

Sealing members of various kinds may be utilized to prevent fluid flow around the periphery of the pressure port body 110. In some instances, a seal may be positioned around the perimeter of the pressure port body 110, while in other embodiments a seal may be disposed against the bottom surface 114 of the pressure port body 110. Still further, in some embodiments, one or more seals may be disposed around the protrusion 120, to prevent fluid communication around the periphery of the protrusion 120. For example, O-rings or similar members may be disposed around the protrusion 120. In embodiments where the bottom opening 124 of the aperture 125 is in communication with a fluid to be measured, such O-rings or other seals may prevent fluid from leaking around the pressure port body 110.

The pressure port body 110 may comprise a single material, including embodiments wherein the pressure port body 110 is integrally formed from a single material. Stated another way, the pressure port body 110 may comprise a continuous or unbroken member. In some instances, the pressure port body 110 may comprise a ceramic material. The ceramic material may be injection-molded such that the entire pressure port body 110, including, for example, the protrusion 120, comprises a continuous and unbroken ceramic element.

The continuous material of the pressure port body 110 may be impermeable to fluid flow across the material. In some embodiments, the pressure port body 110 may be configured for use in communication with harsh or corrosive fluids including both liquids and gasses. The impermeability of the pressure port body 110 may facilitate isolation of such fluids from other portions (such as the electronics assembly 140) of the pressure port assembly 100.

A continuous pressure port body 110 may limit potential fluid leak paths through the pressure port body 110. For example, if the pressure port body 110 were formed of multiple components coupled to each other through adhesives or other means, the joints or adhesive may present a potential leak path. Contrarily, sealing members disposed about the protrusion 120 of the illustrated embodiment may effectively prevent fluid communication between a fluid adjacent the bottom opening 124 and other portions of the pressure port assembly 100 (except along the aperture 125). Thus, only the pressure port body 110, the seals, and the bottom surface of the pressure transducer 130 need to be configured for direct contact with the fluid to be measured. This can facilitate isolation and control of harsh or corrosive fluids only to desired portions of the pressure port assembly 100.

It is within the scope of this disclosure to form or utilize a pressure port body 110 comprising a continuous material, including integrally formed pressure port bodies and other monolithic pressure port bodies.

Still further, in some embodiments, multiple seals may be used to prevent fluid flow around the periphery of the pressure port body 110. For example, one or more O-rings may be disposed about the protrusion 120, and one or more seals may be disposed against the bottom surface 114 of the pressure port body 110. Any joints or openings within the pressure port body 110, including openings between such seals, would reduce the efficacy of the seals, by presenting potential leak paths. Thus, multiple seals may be used in connection with a pressure port body 110 comprising a continuous material in order to isolate or control fluid communication.

The pressure port assembly 100 may thus be used to facilitate disposition of a pressure transducer 130 and/or an electronics assembly 140 on the opposite side of a port member, with respect to the fluid to be measured. An aperture 125 and seals may limit fluid communication only to desired portions of the pressure port assembly 100. This relative arrangement of components may facilitate fluidic sealing, the fluidic isolation of portions of the pressure port assembly 100.

Figure 5:
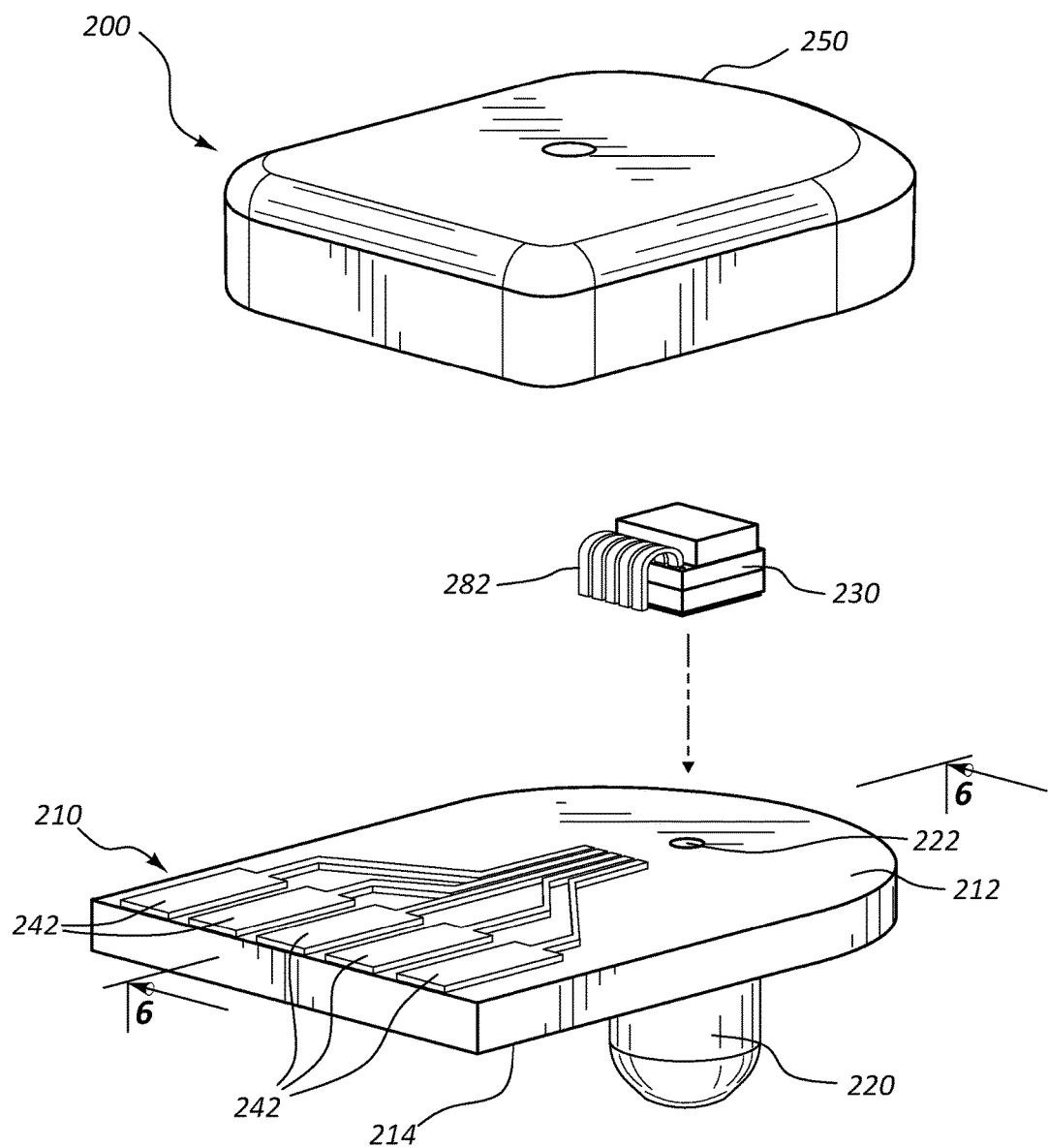
FIG. 5 is an exploded view of a pressure port assembly according to another embodiment.
Figure 6:
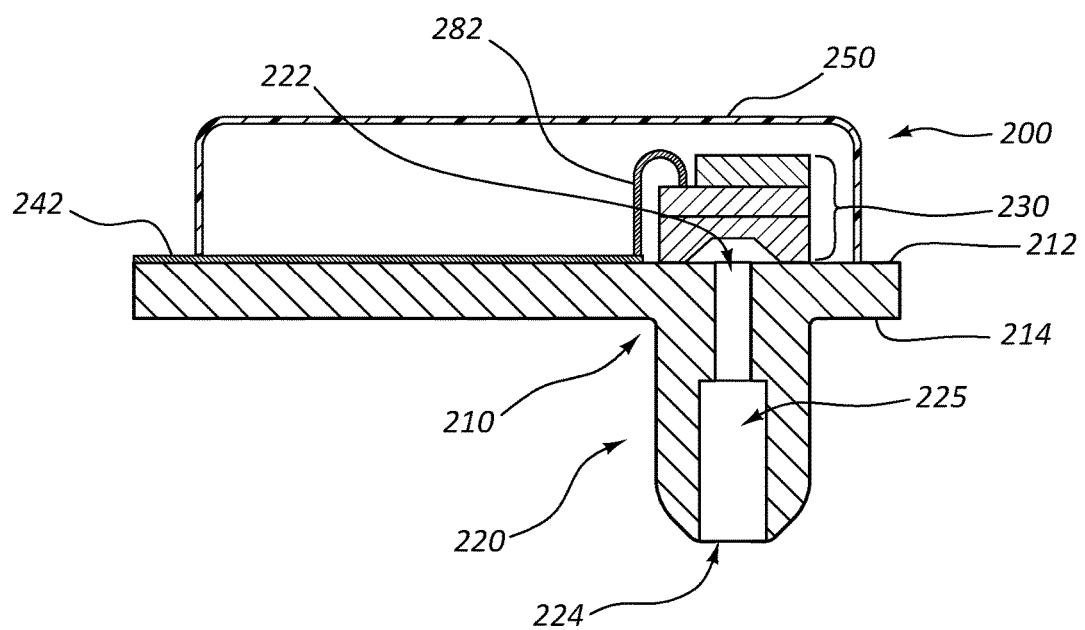
FIG. 6 is a cross-sectional side view of the pressure port assembly of FIG. 5.

FIGS. 5 and 6 depict a pressure port assembly 200 that resembles the pressure port assembly 100 described above in certain respects. Accordingly, like features are designated with like reference numerals, with the leading digits incremented to "2." For example, the embodiment depicted in FIGS. 5 and 6 includes a pressure body port 210 that may, in some respects, resemble the pressure body port 110 of FIGS. 1-4. Relevant disclosure set forth above regarding similarly identified features thus may not be repeated hereafter. Moreover, specific features of pressure port assemblies and related components shown in FIGS. 1-4 may not be shown or identified by a reference numeral in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the pressure port assembly 200 and related components depicted in FIGS. 5 and 6. Any suitable combination of the features, and variations of the same, described with respect to the pressure port assembly 100 and related components illustrated in FIGS. 1-4 can be employed with the pressure port assembly 200 and related components of FIGS. 5 and 6, and vice versa. This pattern of disclosure applies equally to further embodiments depicted in subsequent figures and described hereafter, wherein the leading digits may be further incremented.

As shown in FIGS. 5 and 6, the pressure port assembly 200 includes a pressure port body 210 (alternatively referred to as a sensor mounting body), a pressure sensing element (e.g., pressure transducer 230), and a cover 250, but does not include a chip carrier or board analogous to the chip carrier 144 of FIGS. 1-4. The pressure port assembly 200 also lacks some of the electrical components shown in FIGS. 1-4.

The pressure port body 210 may be a monolithic piece. For example, in some embodiments, the pressure port body 210 is formed from a single piece of ceramic. In some embodiments, the pressure port body 210 includes a fluid-impermeable material. The fluid-impermeable material (e.g., ceramic) may be configured for contact with harsh or corrosive fluids. The impermeability of the pressure port body 210 may isolate and protect others portions of the pressure port assembly 200 from the fluid. In some embodiments, the pressure port body 210 may also be configured to withstand significant changes in pressure. The impermeability of the pressure port body 210 may isolate and protect other portions of the pressure port assembly 200 from significant changes in fluid pressure. In some embodiments, the pressure port body 210 includes a top surface 212 and a bottom surface 214.

In the depicted embodiment, electrical contacts 242 are deposited on or otherwise attached directly to a top surface 212 the pressure port body 210. In some embodiments, the electrical contacts 242 may be deposited on the pressure port body 210 by metallization. Such metallization may be accomplished by various methods. For example, in some embodiments, at least a portion of the top surface 212 of the pressure port body 210 is metallized by plating, such as sputter deposition or vapor deposition under vacuum. In some embodiments, the pressure port body 210 is metallized via gold plating. In some embodiments, metallization is accomplished via electroplating. Such electroplating may be carried out by depositing metal on the top surface 212 of the pressure port body 210 by the use of electrons to form a non-ionic coating on the top surface 212. In some embodiments, metallization is accomplished via electroless plating, also known as chemical or autocatalytic plating. The deposition of metal onto a top surface 212 of a pressure port body 210 via electroless plating may involve reactions that deposit metal onto the surface 212 without the use of external electrical power. For example, metal may be deposited on the top surface 212 of the pressure port body 210 via one or more redox reactions. In some embodiments, metallization is accomplished via screen printing. In some screen printing processes, an "ink" may be prepared by mixing metal or ceramic powders with one or more organic compounds to form a paste. This paste (i.e., the "ink") may be transferred to a substrate (e.g., a top surface 212 of the pressure port body 210) through a patterned woven mesh screen or stencil. Such paste may be applied, for example, using a squeegee. The deposited "ink" may then be dried and heated to a relatively high temperature (e.g., greater than 300° C.). Other methods of metallization may also be used.

Metals that are suitable for metallization may include copper, gold, silver, tin, platinum, palladium, nickel, tungsten, kovar, germanium, aluminum, molybdenum, titanium, chrome, and vanadium, among other metals. Combinations of such metals may also be used. The electrical contacts 242 that are deposited by metallization may be viewed as a metallized coating that is disposed on a portion of the top surface 212 of the pressure port body 210. In some embodiments, the metallized coating is uniformly applied over an entirety of the top surface 212 of the pressure port body 210, and then portions of the coating are removed to create the electrical contacts 242 and/or other electrical pathways.

The electrical contacts 242 may be in electrical communication with a pressure transducer 230. For example, in the depicted embodiment, the electrical contacts 242 are in electrical communication with the pressure transducer 230 via wire bonds 282 that extend from the electrical contacts 242 to the pressure transducer 230. In other embodiments, the electrical contacts 242 may be in direct electrical communication with the pressure transducer 230 or in electrical communication with the pressure transducer 230 in some other way. The electrical contacts 242 may be configured to receive a signal from the transducer 230 (e.g., a signal that is representative of the pressure within a fluid line) and then output and/or relay the signal to other electric components. In other words, the contacts 242 may also be in electrical communication with one or more other components and devices (e.g., an output screen).

In some embodiments, the pressure port body 210 includes a protrusion 220. The protrusion 220 may extend from a bottom surface 214 of the pressure port body 210 and away from the top surface 212 of the pressure port body 210. An aperture 225 may extend across the pressure port body 210 from a top opening 222 to a bottom or distal opening 224 in the protrusion 220. The aperture 225 may provide a defined path for fluid communication across the pressure port body 210.

The pressure transducer 230 may be in fluid communication with the aperture 225. For example, the pressure transducer 230 may be coupled to the top surface 212 of the pressure port body 210 such that the pressure transducer 230 is in fluid communication with the aperture 225. More specifically, in some embodiments, the pressure transducer 230 may be bonded to the top surface 212 of the pressure port body 210, thereby sealing the top opening 222 of the apertures 225. Attachment of the pressure transducer 230 to the top surface 212 in this manner may allow for fluid communication between the aperture 225 and the bottom of the pressure transducer 230, but prevent fluid communication between the aperture 225 and one or more other components of the pressure port assembly 200.

The pressure transducer 230 may be used to sense the pressure of a fluid in the aperture 225 and generate a signal representative of the pressure. For example, when protrusion 220 is disposed within a fluid line such that the aperture 225 is in fluid communication with fluid in the fluid line, the pressure transducer 230 may be used to determine the pressure of fluid within the fluid line. As noted above, a signal representative of the pressure may travel from the transducer 230 to the electrical contacts 242, which enable output of the signal.

The pressure assembly port assembly 200 may also include other components, such as components analogous to those discussed above in connection with FIGS. 1-4. For example, the pressure port assembly may include a cover 250 that is analogous to the cover 150 discussed above. The pressure port assembly 200 may also be a portion of a larger assembly or device.

Figure 7:
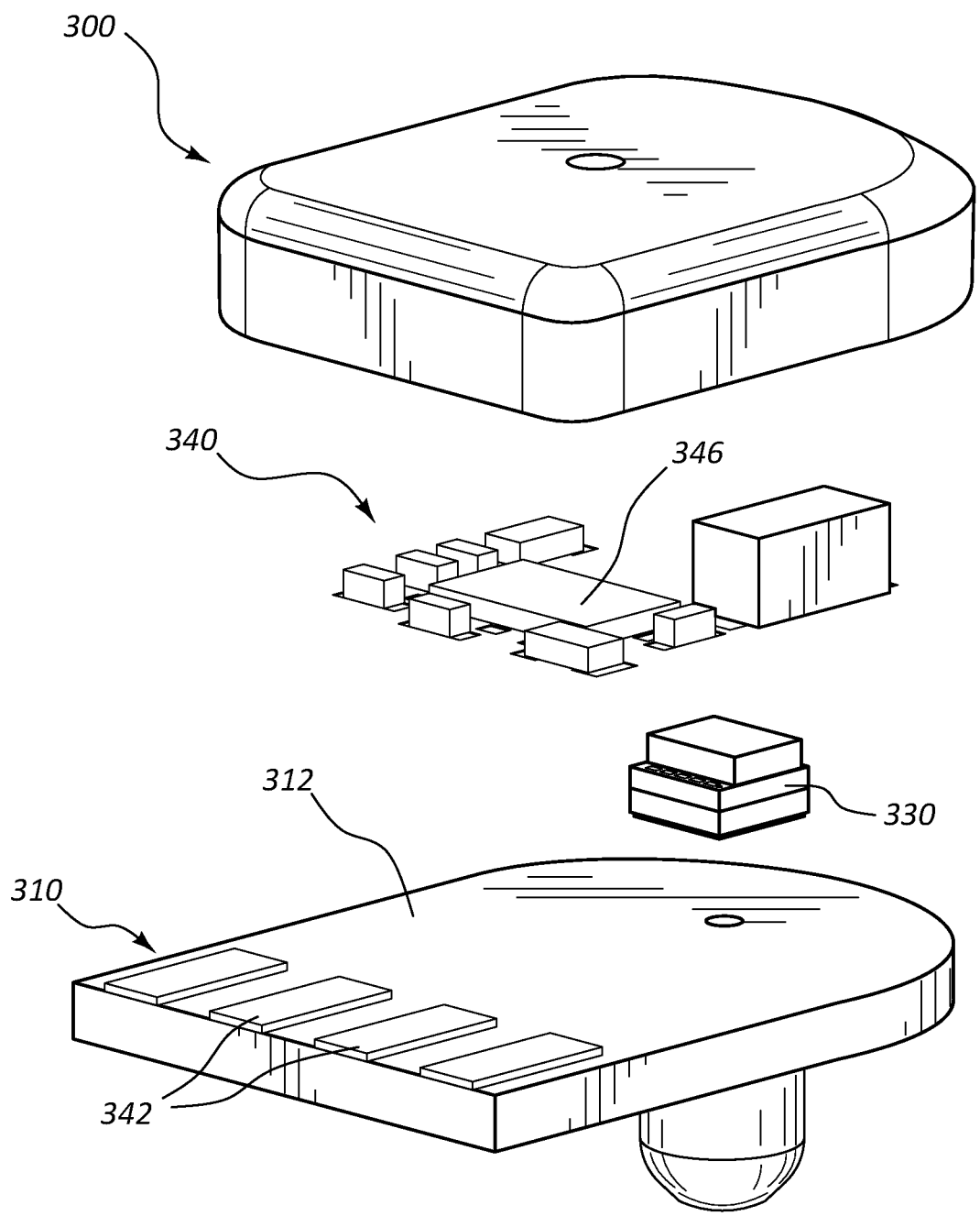
FIG. 7 is an exploded view of a pressure port assembly according to another embodiment.

FIG. 7 provides an exploded view of a pressure port assembly 300 according to another embodiment. The pressure port assembly 300 is analogous to the pressure port assembly 200, except that the pressure port assembly 300 includes various electrical components 340 that are not included in the pressure port assembly 200.

For example, the pressure port assembly 300 includes an integrated circuit 346. When the pressure port assembly 300 is fully assembled, the integrated circuit 346 may be mounted or otherwise coupled to the first flat surface 312 of the pressure mounting body 310. In the depicted embodiment, the integrated circuit 346 is configured to attach to the first flat surface 312 without any intervening chip carrier. In some embodiments, the integrated circuit 346 is an application-specific integrated circuit. Other electronic components, such as resistors, transistors, etc. may also be attached directly to the first flat surface 312. In some embodiments, a signal may travel from the pressure transducer 330 through one or more electrical components 340 (e.g., the integrated circuit 346) to the electrical contacts 342 for output of the signal.

Figure 8A:
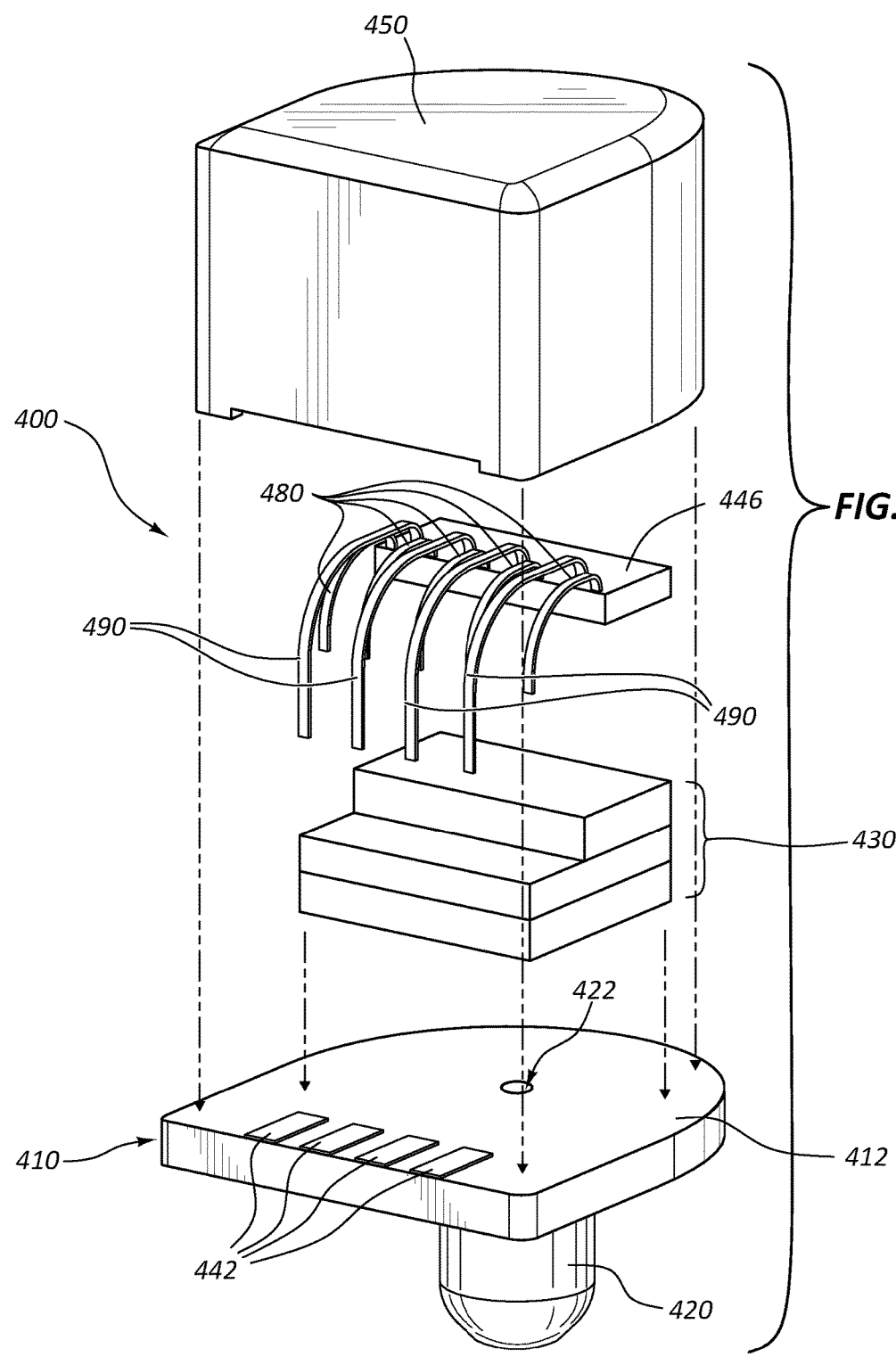
FIG. 8A is an exploded perspective view of a pressure port assembly according to another embodiment.
Figure 8B:
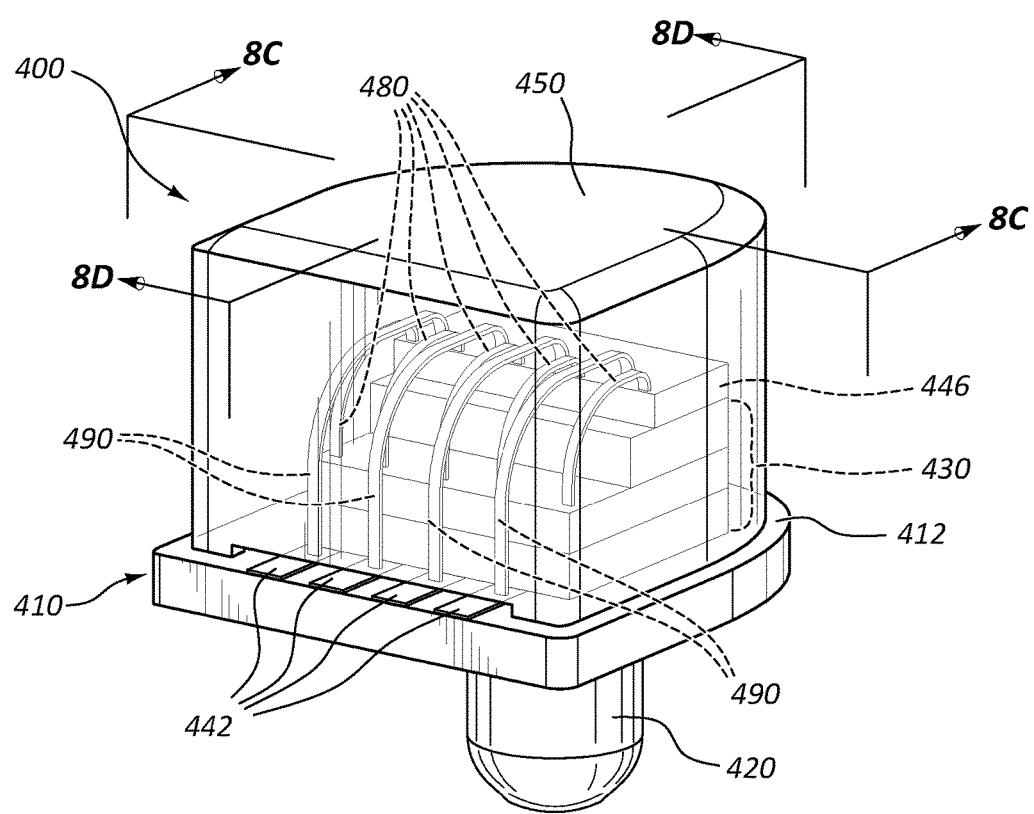
FIG. 8B is a non-exploded pictorial view of the pressure port assembly of FIG. 8A.
Figure 8C:
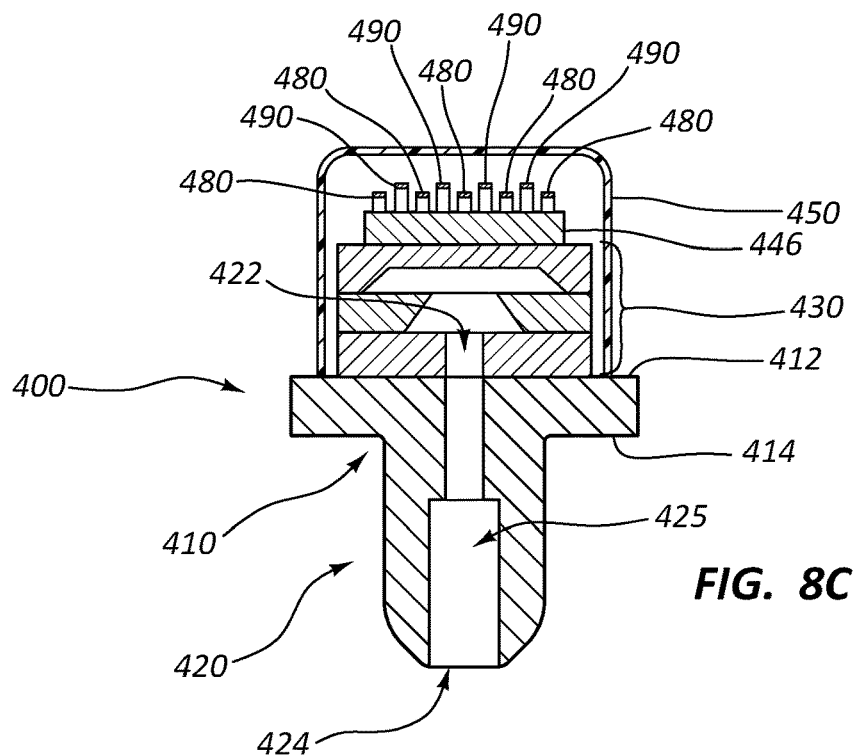
FIG. 8C is a cross-sectional view of the pressure port assembly of FIGS. 8A and 8B through plane 8C-8C.
Figure 8D:
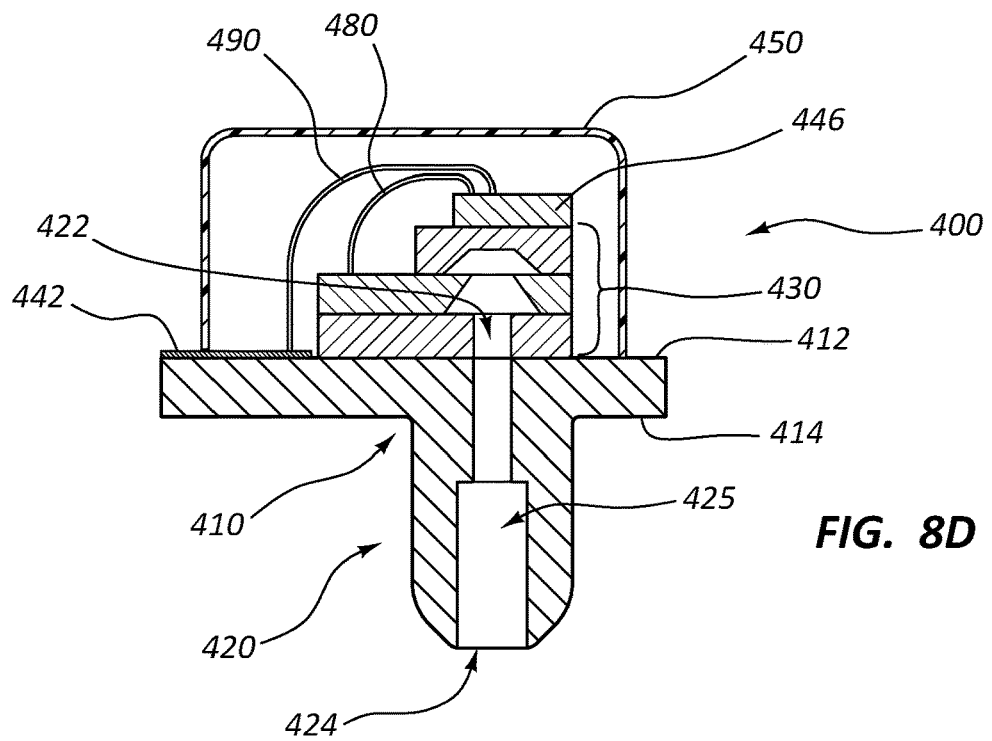
FIG. 8D is a cross-sectional view of the pressure port assembly of FIGS. 8A-8C through plane 8D-8D.

FIGS. 8A-8D provide alternative views of a pressure port assembly 400 according to another embodiment. More particularly, FIG. 8A is an exploded view of the pressure port assembly 400. FIG. 8B is a non-exploded view of the pressure port assembly 400. FIGS. 8C and 8D are different cross-sectional views of the pressure port assembly.

With reference to FIGS. 8A-8D, the pressure port assembly 400 may include a pressure port body 410 (alternatively referred to as a sensor mounting body), a pressure sensing element (e.g., pressure transducer 430), an integrated circuit 446 and a cover 450.

Similar to some of the embodiments described above, the pressure port body 410 may be a monolithic piece. For example, in some embodiments, the pressure port body 410 is formed from a single piece of ceramic. In some embodiments, the pressure port body 410 includes a fluid-impermeable material. The fluid-impermeable material (e.g., ceramic) may be configured to withstand harsh or corrosive fluids. The impermeability of the pressure port body 410 may isolate and protect others portions of the pressure port assembly 400 from the fluid. In some embodiments, the pressure port body 410 may also be configured to withstand significant changes in pressure. The impermeability of the pressure port body 410 may isolate and protect other portions of the pressure port assembly 400 from significant changes in fluid pressure. In some embodiments, the pressure port body 410 includes a top surface 412 and a bottom surface 414.

Electrical contacts 442 may be deposited on or otherwise attached directly to a top surface 412 the pressure port body 410. In some embodiments, the electrical contacts 442 may be deposited on the pressure port body 410 by metallization. Such metallization may be accomplished by, for example, plating, electroplating, electroless plating, or screen printing, although other methods of metallization may also be used. Metals that are suitable for metallization may include copper, gold, silver, tin, platinum, palladium, nickel, tungsten, kovar, germanium, aluminum, molybdenum, titanium, chrome, and vanadium, among other metals. The electrical contacts 442 that are deposited by metallization may be understood as a metallized coating that is disposed on a portion of the top surface 412 of the pressure port body 410.

In some embodiments, the pressure port body 410 includes a protrusion 420. The protrusion 420 may extend from a bottom surface 414 of the pressure port body 410 and away from the top surface 412 of the pressure port body 410. An aperture 425 may extend across the pressure port body 410 from a top opening 422 to a bottom or distal opening 424 in the protrusion 420. The aperture 425 may provide a defined path for fluid communication across the pressure port body 410. In some embodiments, the aperture 425 is the only aperture that extends across the pressure port body 410.

The pressure transducer 430 may be in fluid communication with the aperture 425. For example, the pressure transducer 430 may be coupled to the top surface 412 of the pressure port body 410 such that the pressure transducer 430 is in fluid communication with the aperture. More specifically, in some embodiments, the pressure transducer 430 may be bonded to the top surface 412, thereby sealing the top opening 422 of the aperture 425. Attachment of the pressure transducer 430 to the top surface 412 in this manner may allow for fluid communication between the aperture 425 and the bottom of the pressure transducer 430, but prevent fluid communication between the aperture 425 and one or more other components of the pressure port assembly 400, such as the integrated circuit 446 described below.

An integrated circuit 446 may be coupled to the pressure transducer 430 such that the pressure transducer 430 is disposed between the top surface 412 and the integrated circuit 446. For example, the integrated circuit 446 may be stacked on top of the pressure transducer 430 and coupled to the pressure transducer 430 via an adhesive. This arrangement of components may be more compact than other arrangements in which the integrated circuit 446 and the pressure transducer 430 are not in a stacked configuration.

The pressure transducer 430, the integrated circuit 446, and the electrical contacts 442 may be in electrical communication with one another. For example, the pressure transducer 430 may be electrically connected to the integrated circuit 446 by a first plurality of electrical leads 480. The integrated circuit 430 may, in turn, be electrically connected to the electrical contacts 442 via a second plurality of leads 490. Thus, the pressure transducer 430 may be in electrical communication with the electrical contacts 442 through an integrated circuit 446 and the accompanying leads 480, 490. In FIGS. 8A-8D, the electrical leads 480, 490 are depicted as wires (e.g., gold wires), although other types of electrical leads are also within the scope of this disclosure.

In operation, the pressure transducer 430 may send a signal that is representative of the pressure to the integrated circuit 446. The integrated circuit 446 may perform one or more operations on the signal and then send or relay the signal to the electrical contacts 442. The electrical contacts 442 may be configured for electrical communication with one or more other components and devices. Thus, the electrical contacts 442 may be configured to receive a signal from the pressure transducer 430 (e.g., a signal that is representative of the pressure within a fluid line) and then output and/or relay the signal to other electrical components. In this manner, the pressure port assembly 400 may be used to determine the pressure of fluid within a fluid line.

Various methods of using the systems and devices described above are within the scope of this disclosure. For example, methods of providing fluid communication across a pressure port body and methods of measuring pressures at a location offset from a pressure transducer are within the scope of this disclosure.

Furthermore, methods of forming a pressure port assembly are within the scope of this disclosure. Some such methods include methods of forming a pressure port body through injection-molding, including injection-molding of a ceramic material. Still further, methods of directly metallizing a pressure port body to provide electrical pathways are contemplated by this disclosure.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified. Moreover, sub-routines or only a portion of a method described herein may be a separate method within the scope of this disclosure. Stated otherwise, some methods may include only a portion of the steps described in a more detailed method.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated by one of skill in the art with the benefit of this disclosure that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims following this Detailed Description are hereby expressly incorporated into this Detailed Description, with each claim standing on its own as a separate embodiment. This disclosure includes all permutations of the independent claims with their dependent claims.

Recitation in the claims of the term "first" with respect to a feature or element does not necessarily imply the existence of a second or additional such feature or element. It will be apparent to those having skill in the art that changes may be made to the details of the above-described embodiments without departing from the underlying principles of the present disclosure.

The invention claimed is:

1. A sensor assembly comprising:
   a monolithic sensor mounting body comprising:
      a first flat surface;
      a second flat surface disposed opposite the first flat surface;
      a protrusion extending from the second flat surface and away from the first flat surface; and
      an aperture that extends across the sensor mounting body from an opening in the first flat surface to an opening in the protrusion;
   a metallized coating disposed on at least a portion of the first flat surface of the sensor mounting body;
   a pressure sensor that is coupled to the first flat surface such that the pressure sensor is in fluid communication with the aperture; and
   a cover that partially covers the first flat surface,
   wherein a first portion of the metallized coating is disposed within the cover and a second portion of the metallized coating is disposed outside the cover.

2. The sensor assembly of claim 1, wherein the monolithic sensor mounting body is formed from a fluid-impermeable ceramic material.

3. The sensor assembly of claim 1, wherein the metallized coating is configured for electrical communication with the pressure sensor.

4. The sensor assembly of claim 1, further comprising an integrated circuit that is mounted to the first flat surface of the sensor mounting body.

5. The sensor assembly of claim 4, wherein the pressure sensor is disposed between the first flat surface and the integrated circuit.

6. The sensor assembly of claim 5, wherein the pressure sensor is electrically coupled to the integrated circuit via a first plurality of leads and the integrated circuit is electrically coupled to electrical contacts on the sensor mounting body via a second plurality of leads.

7. A sensor mounting body comprising:
a first flat surface that extends to a perimeter;
a second flat surface disposed opposite the first flat surface and extends to the perimeter;
a protrusion extending from the second flat surface; and
an aperture extending through the sensor mounting body from a distal end of the protrusion to a location on the first flat surface,
wherein the sensor mounting body comprises a continuous material.

8. The sensor mounting body of claim 7, wherein the continuous material comprises a ceramic material.

9. The sensor mounting body of claim 7, wherein the continuous material is impermeable to fluid flow across the continuous material.

10. The sensor mounting body of claim 7, wherein the continuous material is impermeable to liquid flow across the continuous material.

11. A sensor assembly comprising:
a sensor mounting body comprising:
an electronics mounting surface;
a protrusion extending away from the electronics mounting surface; and
an aperture extending from a surface of the protrusion to the electronics mounting surface;
a pressure sensor mounted to the electronics mounting surface such that a portion of the pressure sensor is in fluid communication with the aperture;
one or more electronic contacts mounted to the electronics mounting surface such that the electronic contacts do not extend beyond the electronics mounting surface; and
a cover that partially covers the electronics mounting surface,
wherein a first portion of the one or more electronic contacts is disposed within the cover and a second portion of the one or more electronic contacts is disposed outside the cover.

12. The sensor assembly of claim 11, wherein the sensor mounting body comprises a single continuous material.

13. The sensor assembly of claim 11, wherein the sensor mounting body and pressure sensor isolate the electronics mounting surface from fluid communication with the surface of the protrusion when the sensor mounting body is disposed such that fluid cannot communicate around the periphery of the sensor mounting body.

14. The sensor assembly of claim 11, wherein the one or more electronic contacts are disposed on a membrane coupled to the electronics mounting surface.

15. The sensor assembly of claim 11, wherein the one or more electronic contacts are directly deposited on the electronics mounting surface.

16. The sensor assembly of claim 11, further comprising a sealing component disposed around the protrusion.

17. The sensor assembly of claim 12, wherein the continuous material comprises a ceramic material that is impermeable to fluid flow across the continuous material.

18. The sensor assembly of claim 11, wherein the pressure sensor is disposed between the electronics mounting surface and an integrated circuit.

19. The sensor assembly of claim 11, further comprising a metallized coating on at least a portion of the electronics mounting surface.

20. A method of forming a sensor assembly, the method comprising:
integrally forming a sensor mounting body, the sensor mounting body comprising:
a flat portion defining a first side and a second side;
a protrusion extending from the second side of the flat portion, the protrusion integrally formed with the flat portion; and
an aperture extending from a surface of the protrusion to the first side of the flat portion,
wherein the first side and the second side extend to a perimeter.

21. The method of claim 20, further comprising coupling a sensor to the first side of the flat portion, such that a portion of the sensor is in fluid communication with the aperture.

22. The method of claim 20, further comprising coupling one or more electronic components to the first flat surface.

23. The method of claim 22, wherein the one or more electronic components are coupled to a membrane which is coupled to the first flat surface.

24. The method of claim 20, further comprising coupling a sealing member around the protrusion.

25. The method of claim 20, wherein integrally forming the sensor mounting body comprises forming the sensor mounting body from a continuous ceramic material.

26. The method of claim 20, wherein integrally forming the sensor mounting body comprises injection-molding the sensor mounting body.

27. The method of claim 21, further comprising coupling an integrated circuit to the sensor such that the sensor is disposed between the integrated circuit and the first side of the flat portion.

28. The method of claim 20, further comprising applying a metallized coating to at least a portion of the first side of the flat portion.

* * * * *